US 6,703,144 B2

(12) United States Patent
Fitzgerald

(10) Patent No.: US 6,703,144 B2
(45) Date of Patent: *Mar. 9, 2004

(54) HETEROINTEGRATION OF MATERIALS USING DEPOSITION AND BONDING

(75) Inventor: Eugene A. Fitzgerald, Windham, NH (US)

(73) Assignee: AmberWave Systems Corporation, Salem, NH (US)

(*) Notice: Subject to any disclaimer, the term of this patent is extended or adjusted under 35 U.S.C. 154(b) by 0 days.

This patent is subject to a terminal disclaimer.

(21) Appl. No.: 10/391,086
(22) Filed: Mar. 18, 2003

(65) Prior Publication Data
US 2003/0186073 A1 Oct. 2, 2003

Related U.S. Application Data

(63) Continuation of application No. 09/764,182, filed on Jan. 17, 2001, now Pat. No. 6,602,613
(60) Provisional application No. 60/177,084, filed on Jan. 20, 2000.

(51) Int. Cl.⁷ .................... B32B 15/00; C30B 29/40
(52) U.S. Cl. ................. 428/641; 428/209; 428/642; 428/446; 428/450; 428/697; 428/698; 428/699; 428/704; 428/901; 117/953
(58) Field of Search .................. 428/209, 446, 428/450, 697, 698, 699, 704, 901, 641, 642; 117/953

(56) References Cited

U.S. PATENT DOCUMENTS

| 4,010,045 A | 3/1977 | Ruehrwein .................. 117/102 |
| 4,710,788 A | 12/1987 | Dambkes et al. ............. 357/22 |
| 4,987,462 A | 1/1991 | Kim et al. ..................... 357/22 |
| 4,990,979 A | 2/1991 | Otto .......................... 357/23.5 |

(List continued on next page.)

FOREIGN PATENT DOCUMENTS

| DE | 41 01 167 | 7/1992 |
| EP | 0 514 018 | 4/1992 |
| EP | 0 587 520 | 3/1994 |
| EP | 0 683 522 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |

(List continued on next page.)

OTHER PUBLICATIONS

U.S. patent application Ser. No. 09/599,260 Wu et al., no date.
"Relaxed $Ge_xSi_{1-x}$ structures for III–V integration with Si and high mobility two–dimensional electron gases in Si" by Fitzgerald et al., AT&T Bell Laboratories, Murray Hill NJ 07974; 1992 American Vacuum Society; pp. 1807–1819., no month.

(List continued on next page.)

Primary Examiner—Stephen Stein
(74) Attorney, Agent, or Firm—Testa, Hurwitz & Thibeault, LLP

(57) ABSTRACT

A semiconductor structure including a first substrate, and an epitaxial layer bonded to the substrate. The epitaxial layer has a threading dislocation density of less than $10^7$ cm$^{-2}$ and an in-plane lattice constant that is different from that of the first substrate and a second substrate on which the epitaxial layer is fabricated. In another embodiment, there is provided a method of processing a semiconductor structure including providing a first substrate; providing a layered structure including a second substrate having an epitaxial layer provided thereon, the epitaxial layer having an in-plane lattice constant that is different from that of the first substrate and a threading dislocation density of less than $10^7$ cm$^{-2}$; bonding the first substrate to the layered structure; and removing the second substrate.

9 Claims, 7 Drawing Sheets

U.S. PATENT DOCUMENTS

| | | | |
|---|---|---|---|
| 4,997,776 A | 3/1991 | Harame et al. | 437/31 |
| 5,013,681 A | 5/1991 | Godbey et al. | 438/459 |
| 5,155,571 A | 10/1992 | Wang et al. | 357/42 |
| 5,166,084 A | 11/1992 | Pfiester | 438/151 |
| 5,177,583 A | 1/1993 | Endo et al. | 257/190 |
| 5,202,284 A | 4/1993 | Kamins et al. | 117/106 |
| 5,207,864 A | 5/1993 | Bhat et al. | 156/633 |
| 5,208,182 A | 5/1993 | Narayan et al. | 438/509 |
| 5,212,110 A | 5/1993 | Pfiester et al. | 438/222 |
| 5,221,413 A | 6/1993 | Brasen et al. | 117/98 |
| 5,241,197 A | 8/1993 | Murakami et al. | 257/192 |
| 5,250,445 A | 10/1993 | Bean et al. | 437/11 |
| 5,285,086 A | 2/1994 | Fitzgerald, Jr. | 257/185 |
| 5,291,439 A | 3/1994 | Kauffmann et al. | 365/185 |
| 5,298,452 A | 3/1994 | Meyerson | 437/81 |
| 5,310,451 A | 5/1994 | Tejwani et al. | 438/459 |
| 5,316,958 A | 5/1994 | Meyerson | 437/31 |
| 5,346,848 A | 9/1994 | Grupen-Shemansky et al. | 437/61 |
| 5,374,564 A | 12/1994 | Bruel | 437/24 |
| 5,399,522 A | 3/1995 | Ohori | 437/133 |
| 5,413,679 A | 5/1995 | Godbey | 438/702 |
| 5,424,243 A | 6/1995 | Takasaki | 437/132 |
| 5,426,069 A | 6/1995 | Selvakumar et al. | 437/131 |
| 5,426,316 A | 6/1995 | Mohammad | 257/197 |
| 5,442,205 A | 8/1995 | Brasen et al. | 257/191 |
| 5,461,243 A | 10/1995 | Ek et al. | 257/190 |
| 5,461,250 A | 10/1995 | Burghartz et al. | 257/347 |
| 5,462,883 A | 10/1995 | Dennard et al. | 438/459 |
| 5,476,813 A | 12/1995 | Naruse | 438/311 |
| 5,479,033 A | 12/1995 | Baca et al. | 257/192 |
| 5,484,664 A | 1/1996 | Kitahara et al. | 257/190 |
| 5,523,243 A | 6/1996 | Mohammad | 437/31 |
| 5,523,592 A | 6/1996 | Nakagawa et al. | 257/96 |
| 5,534,713 A | 7/1996 | Ismail et al. | 257/24 |
| 5,536,361 A | 7/1996 | Kondo et al. | 438/592 |
| 5,540,785 A | 7/1996 | Dennard et al. | 148/33.2 |
| 5,596,527 A | 1/1997 | Tomioka et al. | 365/185.2 |
| 5,617,351 A | 4/1997 | Bertin et al. | 365/185.05 |
| 5,630,905 A | 5/1997 | Lynch et al. | 438/507 |
| 5,659,187 A | 8/1997 | Legoues et al. | 257/190 |
| 5,683,934 A | 11/1997 | Candelaria | 438/151 |
| 5,698,869 A | 12/1997 | Yoshimi et al. | 257/192 |
| 5,714,777 A | 2/1998 | Ismail et al. | 257/263 |
| 5,728,623 A | 3/1998 | Mori | 438/455 |
| 5,739,567 A | 4/1998 | Wong | 257/316 |
| 5,759,898 A | 6/1998 | Ek et al. | 438/291 |
| 5,777,347 A | 7/1998 | Bartelink | 257/24 |
| 5,786,612 A | 7/1998 | Otani et al. | 257/316 |
| 5,786,614 A | 7/1998 | Chuang et al. | 257/318 |
| 5,792,679 A | 8/1998 | Nakato | 438/162 |
| 5,808,344 A | 9/1998 | Ismail et al. | 257/369 |
| 5,847,419 A | 12/1998 | Imai et al. | 257/192 |
| 5,877,070 A | 3/1999 | Goesele et al. | 438/458 |
| 5,891,769 A | 4/1999 | Liaw et al. | 438/458 |
| 5,906,708 A | 5/1999 | Robinson et al. | 438/167 |
| 5,906,951 A | 5/1999 | Chu et al. | 438/751 |
| 5,912,479 A | 6/1999 | Mori et al. | 257/192 |
| 5,943,560 A | 8/1999 | Chang et al. | 438/151 |
| 5,963,817 A | 10/1999 | Chu et al. | 438/410 |
| 5,966,622 A | 10/1999 | Levine et al. | 438/459 |
| 5,998,807 A | 12/1999 | Lustig et al. | 257/66 |
| 6,013,134 A | 1/2000 | Chu et al. | 118/715 |
| 6,033,974 A | 3/2000 | Henley et al. | 438/526 |
| 6,033,995 A | 3/2000 | Muller | 438/759 |
| 6,058,044 A | 5/2000 | Sugiura et al. | 365/185.17 |
| 6,059,895 A | 5/2000 | Chu et al. | 148/33.1 |
| 6,074,919 A | 6/2000 | Gardner et al. | 438/287 |
| 6,096,590 A | 8/2000 | Chan et al. | 438/233 |
| 6,103,559 A | 8/2000 | Gardner et al. | 438/289 |
| 6,107,653 A | 8/2000 | Fitzgerald | 257/191 |
| 6,111,267 A | 8/2000 | Fischer et al. | 257/19 |
| 6,117,750 A | 9/2000 | Bensahel et al. | 438/478 |
| 6,130,453 A | 10/2000 | Mei et al. | 257/315 |
| 6,133,799 A | 10/2000 | Favors, Jr. et al. | 331/57 |
| 6,140,687 A | 10/2000 | Shimomura et al. | 257/401 |
| 6,143,636 A | 11/2000 | Forbes et al. | 438/587 |
| 6,153,495 A | 11/2000 | Kub et al. | 372/45 |
| 6,154,475 A | 11/2000 | Soref et al. | 438/459 |
| 6,160,303 A | 12/2000 | Fattaruso | 257/531 |
| 6,162,688 A | 12/2000 | Gardner et al. | 438/289 |
| 6,184,111 B1 | 2/2001 | Henley et al. | 438/514 |
| 6,191,007 B1 | 2/2001 | Matsui et al. | 438/459 |
| 6,191,432 B1 | 2/2001 | Sugiyama et al. | 257/19 |
| 6,194,722 B1 | 2/2001 | Fiorini et al. | 250/338.1 |
| 6,204,529 B1 | 3/2001 | Lung et al. | 257/314 |
| 6,207,977 B1 | 3/2001 | Augusto | 257/192 |
| 6,210,988 B1 | 4/2001 | Howe et al. | 438/50 |
| 6,218,677 B1 | 4/2001 | Broekaert | 257/22 |
| 6,232,138 B1 | 5/2001 | Fitzgerald et al. | 438/46 |
| 6,235,567 B1 | 5/2001 | Huang | 438/510 |
| 6,242,324 B1 | 6/2001 | Kub et al. | 438/455 |
| 6,249,022 B1 | 6/2001 | Lin et al. | 257/324 |
| 6,251,755 B1 | 6/2001 | Furukawa et al. | 438/510 |
| 6,261,929 B1 | 7/2001 | Gehrke et al. | 438/462 |
| 6,266,278 B1 | 7/2001 | Harari et al. | 365/185.18 |
| 6,271,551 B1 | 8/2001 | Schmitz et al. | 257/288 |
| 6,271,726 B1 | 8/2001 | Fransis et al. | 330/254 |
| 6,291,321 B1 | 9/2001 | Fitzgerald | 438/494 |
| 6,313,016 B1 | 11/2001 | Kibbel et al. | 438/478 |
| 6,316,301 B1 | 11/2001 | Kant | 438/197 |
| 6,323,108 B1 | 11/2001 | Kub et al. | 438/458 |
| 6,329,063 B2 | 12/2001 | Lo et al. | 428/450 |
| 6,335,546 B1 | 1/2002 | Tsuda et al. | 257/94 |
| 6,339,232 B1 | 1/2002 | Takagi | 257/192 |
| 6,350,993 B1 | 2/2002 | Chu et al. | 257/19 |
| 6,368,733 B1 | 4/2002 | Nishinaga | 428/698 |
| 6,372,356 B1 | 4/2002 | Thornton et al. | 257/189 |
| 6,399,970 B2 | 6/2002 | Kubo et al. | 257/194 |
| 6,403,975 B1 | 6/2002 | Brunner et al. | 257/15 |
| 6,407,406 B1 | 6/2002 | Tezuka | 257/18 |
| 6,425,951 B1 | 7/2002 | Chu et al. | 117/3 |
| 6,429,061 B1 | 8/2002 | Rim | 438/198 |
| 6,521,041 B2 | 2/2003 | Wu et al. | 117/94 |
| 6,540,937 B1 | 4/2003 | Payne et al. | 331/74 |
| 6,555,839 B2 | 4/2003 | Fitzgerald | 257/18 |
| 6,573,126 B2 | 6/2003 | Cheng et al. | 438/149 |
| 6,583,015 B2 | 6/2003 | Fitzgerald et al. | 438/287 |
| 6,593,191 B2 | 7/2003 | Fitzgerald | 438/282 |
| 6,602,613 B1 * | 8/2003 | Fitzgerald | 428/641 |
| 6,603,156 B2 | 8/2003 | Rim | 257/190 |
| 2001/0003269 A1 | 6/2001 | Wu et al. | 117/94 |
| 2001/0003364 A1 | 6/2001 | Sugawara et al. | 257/192 |
| 2002/0100942 A1 | 8/2001 | Fitzgerald et al. | 257/369 |
| 2002/0043660 A1 | 4/2002 | Yamazaki et al. | 257/59 |
| 2002/0052084 A1 | 5/2002 | Fitzgerald | 438/282 |
| 2003/0013323 A1 | 6/2002 | Hammond et al. | 438/981 |
| 2002/0096717 A1 | 7/2002 | Chu et al. | 257/347 |
| 2002/0123167 A1 | 9/2002 | Fitzgerald | 438/199 |
| 2002/0123183 A1 | 9/2002 | Fitzgerald | 438/285 |
| 2002/0123197 A1 | 9/2002 | Fitzgerald et al. | 438/285 |
| 2002/0125471 A1 | 9/2002 | Fitzgerald et al. | 257/191 |
| 2002/0125497 A1 | 9/2002 | Fitzgerald | 257/191 |
| 2002/0140031 A1 | 10/2002 | Rim | 257/347 |
| 2002/0168864 A1 | 11/2002 | Cheng et al. | 438/725 |
| 2003/0003679 A1 | 1/2003 | Doyle et al. | 438/406 |
| 2003/0025131 A1 | 2/2003 | Lee et al. | 257/200 |
| 2003/0034529 A1 | 2/2003 | Fitzgerald et al. | 257/369 |
| 2003/0057439 A1 | 3/2003 | Fitzgerald | 257/192 |
| 2003/0077867 A1 | 4/2003 | Fitzgerald | 438/285 |
| 2003/0102498 A1 | 6/2003 | Braithwaite et al. | 257/288 |

FOREIGN PATENT DOCUMENTS

| | | |
|---|---|---|
| FR | 2 701 599 | 9/1993 |
| GB | 2 342 777 | 4/2000 |
| JP | 4-307974 | 10/1992 |
| JP | 6-252046 | 11/1992 |
| JP | 5-166724 | 7/1993 |
| JP | 6-177046 | 6/1994 |
| JP | 6-244112 | 9/1994 |
| JP | 7-106446 | 4/1995 |
| JP | 7-094420 | 6/1995 |
| JP | 7-240372 | 9/1995 |
| JP | 10-270685 | 10/1998 |
| JP | 11-233744 | 8/1999 |
| JP | 2000-31491 | 1/2000 |
| JP | 2000-021783 | 8/2000 |
| JP | 2001319935 | 11/2001 |
| JP | 2002-076334 | 3/2002 |
| JP | 2002-164520 | 6/2002 |
| JP | 2002-289533 | 10/2002 |
| WO | WO 98/59365 | 12/1998 |
| WO | WO 99/53539 | 10/1999 |
| WO | WO 00/48239 | 8/2000 |
| WO | 00/54338 | 9/2000 |
| WO | 01/22482 | 3/2001 |
| WO | WO 01/54202 | 7/2001 |
| WO | 01/93338 | 12/2001 |
| WO | WO 01/99169 A2 | 12/2001 |
| WO | 02/13262 | 2/2002 |
| WO | WO 02/15244 A2 | 2/2002 |
| WO | WO 02/27783 A1 | 4/2002 |
| WO | 02/47168 | 6/2002 |
| WO | 02/071488 | 9/2002 |
| WO | 02/071491 | 9/2002 |
| WO | WO 02/071495 A1 | 9/2002 |
| WO | WO 02/082514 A1 | 10/2002 |

OTHER PUBLICATIONS

"Demonstration of a GaAs–Based Complian Substrate Using Wafer Bonding and Substrate Removal Techniques"; by Zhanh et al., Electronic Materials and Processing Research Laboratory, Department of Electrical Engineering, University Park, PA 16802; pp. 25–28., no date.

IBM Technical Disclosure Bulletin, vol. 32, No. 8A, Jan. 1990, "Optimal Growth Technique and Structure for Strain Relaxation of Si–Ge Layers on Si Substrates", pp. 330–331.

Maszara, "Silicon–On–Insulator by Wafer Bonding: A Review, " *Journal of the Electrochemical Society*, No. 1 (Jan. 1991) pp. 341–347.

Chang et al., "Selective Etching of SiGe/Si Heterostructures," *Journal of the Electrochemical Society*, No. 1 (Jan. 1991) pp. 202–204.

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug 12, 1991) pp. 811–813.

Feijoo et al., "Epitaxial Si–Ge Etch Stop Layers with Ethylene Diamine Pyrocatechol for Bonded and Etchback Silicon–on–Insulator," *Journal of Electronic Materials*, vol. 23, No. 6 (Jun. 1994) pp. 493–496.

Bruel, "Silicon on Insulator Material Technology," *Electronic Letters*, vol. 13, No. 14 (Jul. 6, 1995) pp. 1201–1202.

Bruel et al., "®SMART CUT: A Promising New SOI Material Technology," *Proceedings 1995 IEEE International SOI Conference* (Oct. 1995) pp. 178–179.

Ismail, "Si/SiGe High–Speed Field–Effect Transistors," *Electron Devices Meeting, Washington, D.C.* . (Dec. 10, 1995) pp. 20.1.1–20.1.4.

Sadek et al., "Design of Si/SiGe Heterojunction Complementary Metal–Oxide–Semiconductor Transistors," *IEEE Trans., Electron Devices* (Aug. 1996) pp. 1224–1232.

Usami et al., "Spectroscopic study of Si–based quantum wells with neighboring confinement structure," *Semicon. Sci. Technol.* (1997) (abstract)., no month.

König et al., "Design Rules for n–Type SiGe Hetero FETs, " *Solid State Electronics* , vol. 41, No. 10 (1997), pp. 1541–1547., no month.

Ishikawa et al., "Creation of Si–Ge–based SIMOX structures by low energy oxygen implantation," *Proceedings 1997 IEEE International SOI Conference* (Oct. 1997) pp. 16–17.

Maiti et al., "Strained–Si heterostructure field effect transistors," *Semicond. Sci. Technol.*, vol. 13 (1998) pp. 1225–1246., no month.

Borenstein et al., "A New Ultra–Hard Etch–Stop Layer for High Precision Micromachining," *Proceedings of the 1999 12th IEEE International Conference on Micro Electro Mechanical Systems (MEMs)* (Jan. 17–21, 1999) pp. 205–210.

Ishikawa et al., "SiGe–on–insulator substrate using SiGe alloy grown Si(001)," *Applied Physics Letters*, vol. 75, No. 7 (Aug. 16, 1999) pp. 983–985.

Mizuno et al., "Electron and Hold Mobility Enhancement in Strained–Si MOSFET's on SiGe–on–Insulator Substrates Fabricated by SIMOX Technology," *IEEE Electron Device Letters*, vol. 21, No. 5 (May 2000) pp. 230–232.

Yeo et al., "Nanoscale Ultra–Thin–Body Silicon–on–Insulator P–MOSFET with a SiGe/Si Heterostructure Channel," *IEEE Electron Device Letters*, vol. 21, No. 4 (Apr. 2000) pp. 161–163.

Huang et al., "High–quality Strain–relaxed SiGe alloy grown on implanted silicon–on–insulator substrate," *Applied Physics Letters*, vol. 76, No. 19 (May 8, 2000) pp. 2680–2682.

Hackbarth et al., "Alternatives to thick MBE–grown relaxed SiGe Buffers," *Thin Solid Films*, vol. 369, No. 1–2 (Jul. 2000) pp. 148–151.

Barradas et al., "RBS analysis of MBE–grown SiGe/(001) Si heterostructures with thin, high Ge content SiGe channels for HMOS transistors," *Modern Physics Letters B* (2001) (abstract)., no month.

Tweet et al., "Factors determining the composition of strained GeSi layers grown with disilane and germane," *Applied Physics Letters*, vol. 65, No. 20 (Nov. 14, 1994) pp. 2579–2581.

Armstrong et al., "Design of Si/SiGe Heterojunction Complementary Metal–Oxide–Semiconductor Transistors," *IEDM Technical Digest* (1995 International Electron Devices Meeting) pp. 761–764. (no month).

Armstrong, "Technology for SiGe Heterostructure–Based CMOS Devices", PhD Thesis, Massachusetts Institute of Technology, 1999, pp. 1–154. (no month).

Augusto et al., "Proposal for a New Process Flow for the Fabrication of Silicon–based Complementary MOD–MOSFETs without ion Implantation," Thin Solid Films, vol. 294, No. 1–2, pp. 254–258 (Feb. 15, 1997).

Bouillon et al., "Search for the optimal channel architecture for 0.18/0.12 $\mu$m bulk CMOS Experimental study," IEEE, (1996) pp. 21.2.1–21.2.4.

Bufler et al., "Hole transport in strained Si1–xGex alloys on Si1–yGey substrates," Journal of Applied Physics, vol. 84, No. 10 (Nov. 15, 1998) pp. 5597–5602.

Burghartz et al., "Microwave Inductors and Capacitors in Standard Multilevel Interconnect Silicon Technology", IEEE Transactions on Microwave Theory and Techniques, vol. 44, No. 1, Jan. 1996, pp. 100–104.

Canaperi et al., "Preparation of a relaxed Si–Ge layer on an insulator in fabricating high–speed semiconductor devices with strained epitaxial films," International Business Machines Corporation, USA (2002) (abstract).

Carlin et al., "High Efficiency GaAs–on–Si Solar Cells with High Voc Using Graded GeSi Buffers," IEEE (2000) pp. 1006–1011.

Cheng et al., "Electron Mobility Enhancement in Strained–Si n–MOSFETs Fabricated on SiGe–on–Insulator (SGOI) Substrates," IEEE Electron Device Letters, vol. 22, No. 7 (Jul. 2001) pp. 321–323.

Cheng et al., "Relaxed Silicon–Germanium on Insulator Substrate by Layer Transfer," Journal of Electronic Materials, vol. 30, No. 12 (2001) pp. L37–L39.

Cullis et al, "Growth ripples upon strained SiGe epitaxial layers on Si and misfit dislocation interactions," Journal of Vacuum Science and Technology A, vol. 12, No. 4 (Jul./Aug. 1994) pp. 1924–1931.

Currie et al., "Controlling Threading Dislocation in Ge on Si Using Graded SiGe Layers and Chemical–Mechanical Polishing," vol. 72 No. 14, pp. 1718–1720, Feb. 1998.

Currie et al., "Carrier mobilities and process stability of strained S in–and p–MOSFETs on SiGe virtual substrates," J. Vac. Sci. Technol. B., vol. 19, No. 6 (Nov./Dec. 2001) pp. 2268–2279.

Eaglesham et al., "Dislocation–Free Stranski–Krastanow Growth of Ge on Si(100)," Physical Review Letters, vol. 64, No. 16 (Apr. 16, 1990) pp. 1943–1946.

Fischetti et al., "Band structure, deformation potentials, and carrier mobility in strained Si, Ge, and SiGe alloys," J. Appl. Phys., vol. 80, No. 4 (Aug. 15, 1996) pp. 2234–2252.

Fischetti, "Long–range Coulomb interactions in small Si devices. Part II. Effective electronmobility in thin–oxide structures," Journal of Applied Physics, vol. 89, No. 2 (Jan. 15, 2001) pp. 1232–1250.

Fitzgerald et al., "Dislocation dynamics in relaxed graded composition semiconductors," Materials Science and Engineering B67, (1999) pp. 53–61.

Garone et al., "Silicon vapor phase epitaxial growth catalysis by the presence of germane," Applied Physics Letters, vol. 56, No. 13 (Mar. 26, 1990) pp. 1275–1277.

Gray and Meyer, "Analysis and Design of Analog Integrated Circuits", John Wiley & Sons, 1984, pp. 605–632.

Grützmacher et al., "Ge segregation in SiGe/Si heterostructures and its dependence on deposition technique and growth atmosphere," Applied Physics Letters, vol. 63, No. 18 (Nov. 1, 1993) pp. 2531–2533.

Hackbrath et al., "Strain relieved SiGe buffers for Si–based heterostructure field–effect transistors," Journal of Crystal Growth, vol. 201/202 (1999) pp. 734–738.

Herzog et al., "SiGe–based FETs: buffer issues and device results," Thin Solid Films, vol. 380 (2000) pp. 36–41.

Höck et al., "Carrier mobilities in modulation doped Si1–xGex heterostructures with respect to FET applications," Thin Solid Films, vol. 336 (1998) pp. 141–144.

Höck et al., "High hole mobility in Si0.17 Ge0.83 channel metal–oxide–semiconductor field–effect transistors grown by plasma–enhanced chemical vapor deposition," Applied Physics Letters, vol. 76, No. 26 (Jun. 26, 2000) pp. 3920–3922.

Höck et al., "High performance 0.25 μm p–type Ge/SiGe MODFETs," Electronics Letters, vol. 34, No. 19 (Sep. 17, 1998) pp. 1888–1889.

Huang et al., "The Impact of Scaling Down to Deep Submicron on CMOS RF Circuits", IEEE Journal of Solid–State Circuits, vol. 33, No. 7, Jul., 1998, pp. 1023–1036.

IBM Technique Disclosure Bulletin, vol. 35, No. 4B (Sep. 1992), "2 Bit/Cell EEPROM Cell Using Band to Band Tunneling for Data Read–Out," pp. 136–140.

Tsang et al., "Measurements of alloy composition and strain in thin $Ge_xSi_{1-x}$ layers," J. Appl. Phys., vol. 75 No. 12 (Jun. 15, 1994) pp. 8098–8108.

Ismail et al., "Modulation–doped n–type Si/SiGe with inverted interface," Appl. Phys. Lett., vol. 65, No. 10 (Sep. 5, 1994) pp. 1248–1250.

Kearney et al., "The effect of alloy scattering on the mobility of holes in a Si 1–xGex quantum well," Semicond.Sci Technol., vol. 13 (1998) pp. 174–180.

Kim et al., "A Fully Integrated 1.9–GHz CMOS Low–Noise Amplifier", IEEE Microwave and Guided Wave Letters, vol. 8, No. 8, Aug. 1998, pp. 293–295.

Koester et al., "Extremely High Transconductance Ge/Si0.4Ge0.6 p–MODFET's Grown by UHV–CVD," IEEE Electron Device Letters, vol. 21, No. 3 (Mar. 2000) pp. 110–112.

König et al., "p–Type Ge–Channel MODFET's with High Transconductance Grown on Si Substrates," IEEE Electron Device Letters, vol. 14, No. 4 (Apr. 1993) pp. 205–207.

König et al., "SiGe HBTs and HFETs," Solid–State Electronics, vol. 38, No. 9 (1995) pp. 1595–1602.

Kuznetsov et al., "Technology for high–performance n–channel SiGe modulation–doped field–effect transistors," J. Vac. Sci. Technol., B 13(6), pp. 2892–2863 (Nov./Dec. 1995).

Larson, "Integrated Circuit Technology Options for RFIC's Present Status and Future Directions", IEEE Journal of Solid–State Circuits, vol. 33, No. 3, Mar. 1998, pp. 387–399.

Lee and Wong, "CMOS RF Integrated Circuits at 5 GHz and Beyond", Proceedings of the IEEE, vol. 88, No. 10, Oct. 2000, pp. 1560–1571.

Lee et al., "Strained Ge channel p–type metal–oxide–semiconductor field–effect transistors grown on Si 1–xGex/Si virtual substrates," Applied Physics Letters, vol. 79, No. 20 (Nov. 12, 2001) pp. 3344–3346.

Lee et al., "Strained Ge channel p–type MOSFETs fabricated on Si1 x–Gex/Si virtual substrates," Mat. Res. Soc. Symp. Proc., vol. 686 (2002) pp. A1.9.1–A1.9.5.

Leitz et al., "Channel Engineering of SiGe–Based Heterostructures for High Mobility MOSFETs," Mat. Res. Soc. Symp. Proc., vol. 686 (2002) pp. A3.10.1–A3.10.6.

Leitz et al., "Dislocation glide and blocking kinetics in compositionally graded SiGe/Si," Journal of Applied Physics, vol. 90, No. 6 (Sep. 15, 2001) pp. 2730–2736.

Leitz et al., "Hole mobility enhancements in strained Si/Si1–yGey p–type metal–oxide–semiconductor field–effect transistors grown on relaxed Si1–xGex(x<y) virtual substrates," Applied Physics Letters, vol. 79, No. 25 (Dec. 17, 2001) pp. 4246–4248.

Li et al., "Design of high speed Si/SiGe heterojunction complementary metal–oxide–semiconductor field effect transistors with reduced short–channel effects," J. Vac. Sci. Technol., A vol. 20 No. 3 (May/Jun. 2002) pp. 1030–1033.

Lu et al., "High Performance 0.1 m Gate–Length P–Type SiGe MODFET's and MOS–MODFET's", IEEE Transactions on Electron Devices, vol. 47, No. 8, Aug. 2000, pp. 1645–1652.

M. Kummer et al., "Low energy plasma enhanced chemical vapor deposition," Materials Science and Engineering B89 (2002) pp. 288–295.

Meyerson et al., "Cooperative Growth Phenomena in Silicon/Germanium Low–Temperature Epitaxy," Applied Physics Letters, vol. 53, No. 25 (Dec. 19, 1988) pp. 2555–2557.

Mizuno et al., "Advanced SOI–MOSFETs with Strained–SI Channel for High Speed CMOS–Electron/Hole Mobility Enhancement, " 2002 Symposium on VLSI Technology, Digest of Technical Papers, Honolulu, (Jun. 13–15), IEEE New York, NY, pp. 210–211.

Mizuno et al., "High Performance Strained–Si p–MOSFETs on SiGe–on–Insulator Substrates Fabricated by SIMOX Technology," IEEE IDEM Technical Digest, (1999 International Electron Device Meeting) pp. 934–936.

Nayak et al., "High–Mobility Strained–Si PMOSFET's"; IEEE Transactions on Electron Devices, vol. 43, No. 10, Oct. 1996, pp. 1709–1716.

O'Neill et al., "SiGe Virtual substrate N–channel heterojunction MOSFETS," Semicond. Sci. Technol., vol. 14 (1999) pp. 784–789.

Ota, Y. et al..; "Application of heterojunction FET to power amplifier for cellular telephone," Electronic Letters, IEE Stevanage, GB, vol. 30 No. 11, May 26, 1994, pp. 906–907.

Papananos, "Radio–Frequency Microelectronic Circuits for Telecommunication Applications", Kluwer Academic Publishers, 1999, pp. 115–117, 188–193.

Parker et al., "SiGe heterostructure CMOS circuits and applications," Solid State Electronics, vol. 43 (1999) pp. 1497–1506.

Ransom et al., "Gate–Self–Aligned n–channel and p–channel Germanium MOSFET's," IEEE Transactions on Electron Devices, vol. 38, No. 12 (Dec. 1991) p. 2695.

Reinking et al., "Fabrication of high–mobility Ge p–channel MOSFETs on Si substrates," Electronics Letters, vol. 35, No. 6 (Mar. 18, 1999) pp. 503–504.

Rim et al., "Enhanced Hole Mobilities in Surface–channel Strained–Si p–MOSFETs"; IEDM, 1995, pp. 517–520.

Rim et al., "Fabrication and Analysis of Deep Submicron Strained–Si N–MOSFET's"; IEEE Transactions on Electron Devices, vol. 47, No. 7, Jul. 2000, pp. 1406–1415.

Rim, "Application of Silicon–Based Heterostructures to Enhanced Mobility Metal–Oxide–Semiconductor Field–Effect Transistors", PhD Thesis, Stanford University, 1999; pp. 1–184.

Robbins et al., "A model for heterogeneous growth of Si1–xGex films for hydrides," Journal of Applied Physics, vol. 69, No. 6 (Mar. 15, 1991) pp. 3729–3732.

Schäffler, "High–Mobility Si and Ge Structures," Semiconductor Science and Technology, vol. 12 (1997) pp. 1515–1549.

Sugimoto and Ueno, "A 2V, 500 MHz and 3V, 920 MHz Low–Power Current–Mode 0.6 $\mu$m CMOS VCO Circuit", IEICE Trans, Electron., vol. E82–C, No. 7, Jul. 1999, pp. 1327–1329.

Ternent et al., "Metal Gate Strained Silicon MOSFETs for Microwave Integrated Circuits", IEEE Oct. 2000, pp. 38–43.

Welser et al., "Electron Mobility Enhancement in Strained–Si N–Type Metal–Oxide–Semiconductor Field–Effect Transistors," IEEE Electron Device Letters, vol. 15, No. 3 (Mar. 1994) pp. 100–102.

Welser et al., "Evidence of Real–Space Hot–Electron Transfer in High Mobility, Strained–Si Multilayer MOSFETs," IEEE IDEM Technical Digest (1993 International Electron Devices Meeting) pp. 545–548.

Welser et al., "NMOS and PMOS Transistors Fabricated in Strained Silicon/Relaxed Silicon–Germanium Structures," IEEE IDEM Technical Digest (1992 International Electron Devices Meeting) pp. 1000–1002.

Welser, "The Application of Strained Silicon/Relaxed Silicon Germanium Heterostructures to Metal–Oxide–Semiconductor Field–Effect Transistors," PhD Thesis, Stanford University, 1994, pp. 1–205.

Wolf and Tauber, *Silicon Processing for the ULSI Era, vol. 1: Process Technology*, Lattice Press, Sunset Beach, CA, pp. 384–386 (1986).

Xie et al., "Semiconductor Surface Roughness: Dependence on Sign and Magnitude of Bulk Strain," The Physical Review Letters, vol. 73, No. 22 (Nov. 28, 1994) pp. 3006–3009.

Xie et al., "Very high mobility two–dimensional hole gas in Si/ GexSi1–x/Ge structures grown by molecular beam epitaxy," Appl. Phys. Lett., vol. 63, No. 16 (Oct. 18, 1993) pp. 2263–2264.

Xie, "SiGe Field effect transistors," Materials Science and Engineering, vol. 25 (1999) pp. 89–121.

Sakaguchi et al., "ELTRAN® by Splitting Porous Si Layers," Proc. 195th Int. SOI Symposium, vol. 99–3, *Electrochemical Society* (1999) pp. 117–121.

Yamagata et al., "Bonding, Splitting and Thinning by Porous Si in ELTRAN®; SOI–Epi Wafer™," *Mat. Res. Soc. Symp. Proc.*, vol. 681E (2001) pp. I8.2.1–I8.2.10.

* cited by examiner

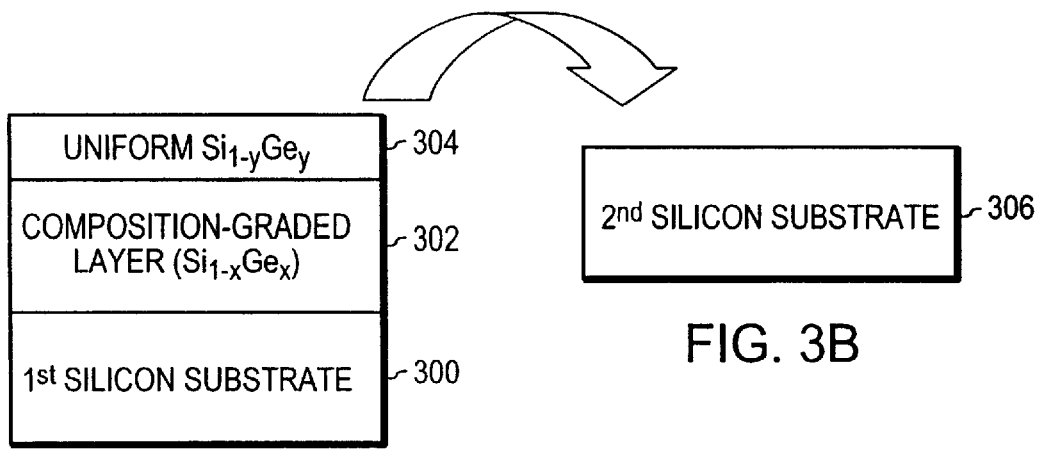
FIG. 3A
FIG. 3B
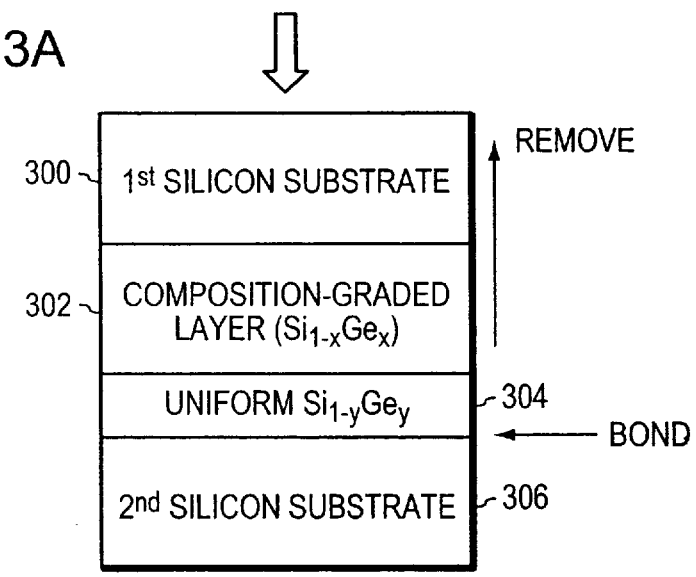
FIG. 3C
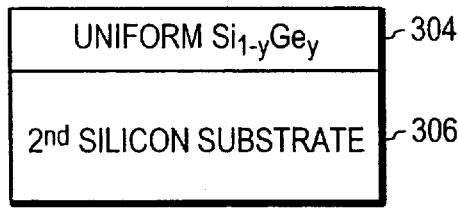
FIG. 3D

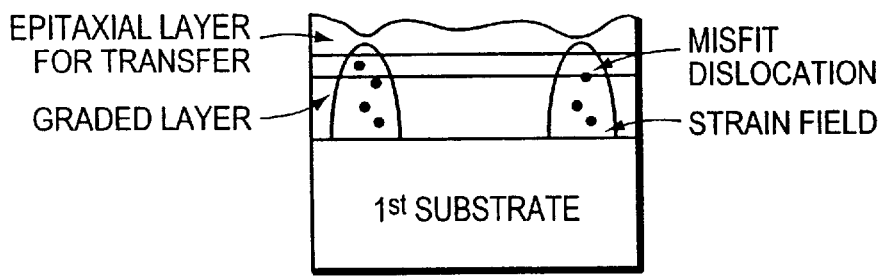
FIG. 4A
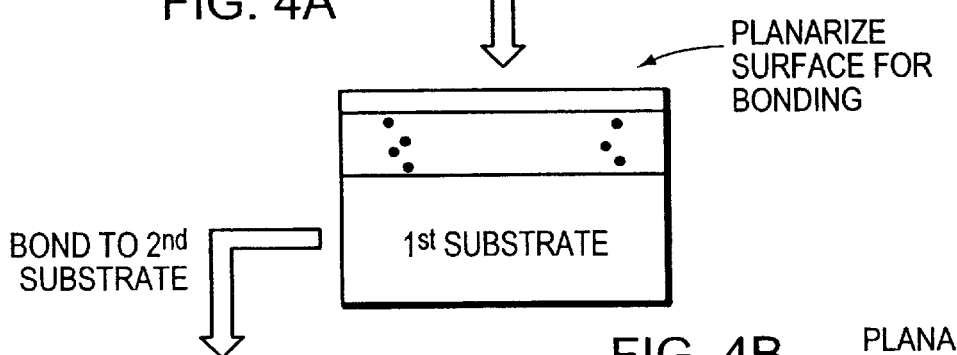
FIG. 4B
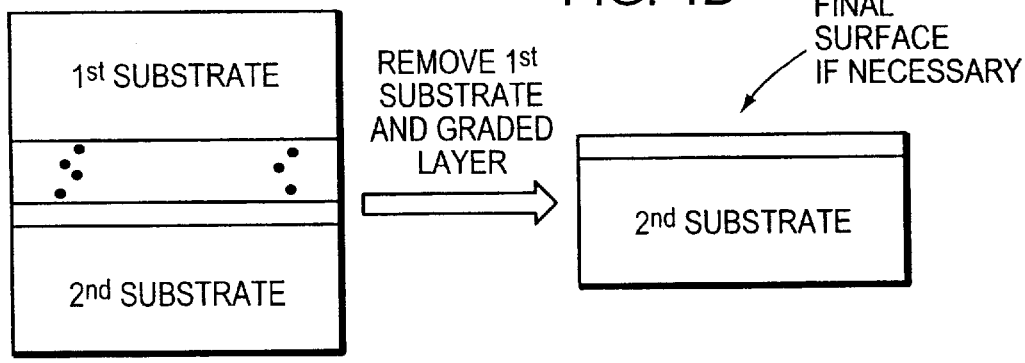
FIG. 4C
FIG. 4D

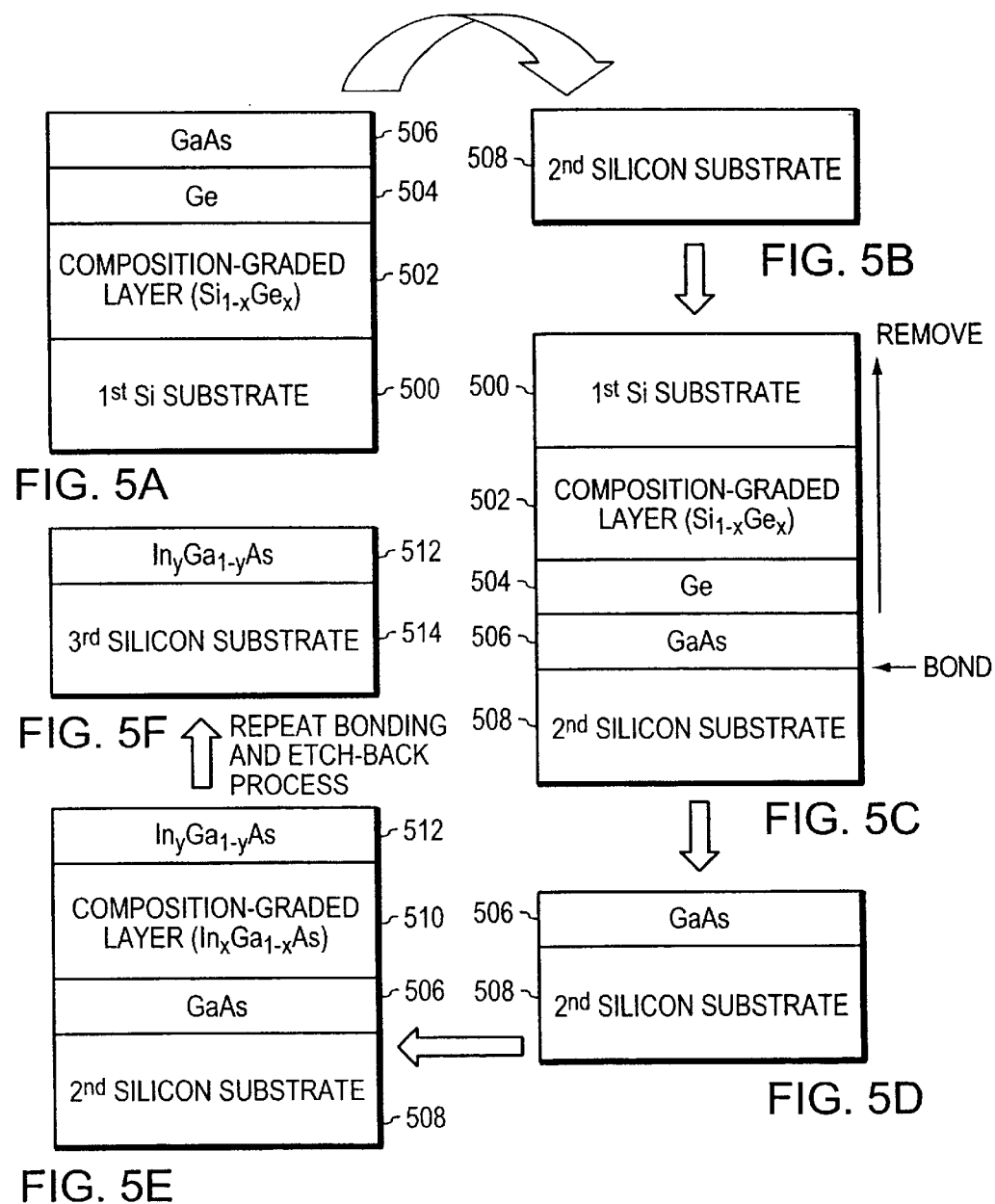

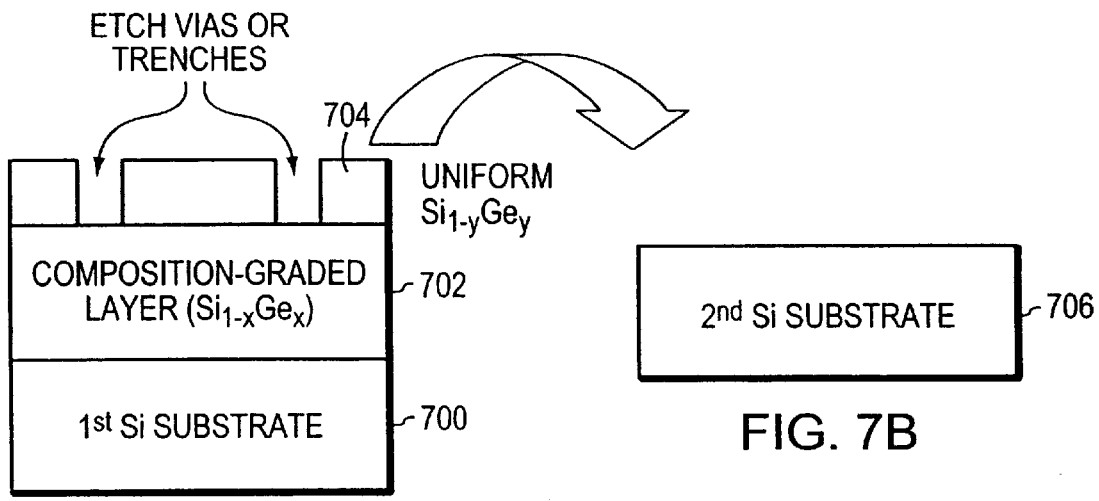
FIG. 7A
FIG. 7B
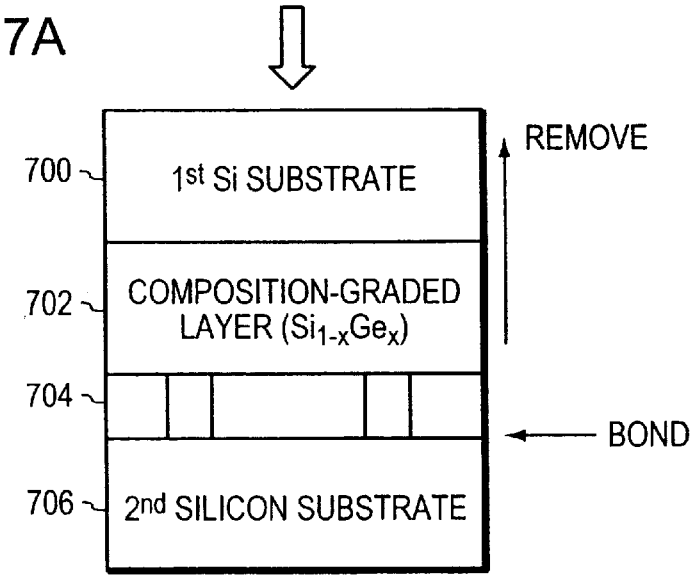
FIG. 7C
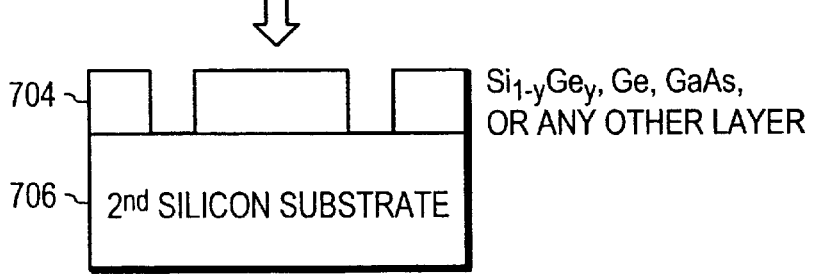
FIG. 7D

HETEROINTEGRATION OF MATERIALS USING DEPOSITION AND BONDING

PRIORITY INFORMATION

This is a continuation of application Ser. No. 09/764,182, now U.S. Pat. No. 6,602,613 filed Jan. 17, 2001, which claims priority from provisional application Ser. No. 60/177,084 filed Jan. 20, 2000.

BACKGROUND OF THE INVENTION

The invention relates to the field of heterointegration of materials using deposition and bonding.

The goal of combining different materials on a common substrate is desirable for a variety of integrated systems. Specifically, it has been a long-standing desire to combine different semiconductor and oxide materials on a common useful substrate such as a silicon substrate. However, just as the different materials properties are beneficial from the system application perspective, other properties make such materials combinations problematic in processing.

For example, semiconductor materials with different properties often have different lattice constants. Therefore, deposition of one semiconductor material on top of another substrate material results in many defects in the semiconductor layer, rendering it useless for practical application. Another method of integrating materials is through the use of wafer bonding. The bonding process removes the lattice mismatch problem. However, this problem is replaced with a mismatch in thermal expansion. Due to the different thermal expansion coefficients in the bonded materials, the materials cannot be subsequently processed or annealed at optimum temperatures without inducing material degradation (i.e. greater residual stress or introduction of dislocations). A final issue is that due to the different material properties, the bulk crystal materials are often different size (boule diameter). This disparity is undesirable for wafer bonding since only a portion of the composite is useful for device/system fabrication.

SUMMARY OF THE INVENTION

Accordingly, the invention provides a semiconductor structure including a first substrate, and an epitaxial layer bonded to the substrate. The epitaxial layer has a threading dislocation density of less than $10^7$ cm$^{-2}$ and an in-plane lattice constant that is different from that of the first substrate and a second substrate on which the epitaxial layer is fabricated. In an exemplary embodiment, the epitaxial layer is a segment of a previously fabricated layered structure including the second substrate with a compositionally graded layer and the epitaxial layer provided thereon. The second substrate and the graded layer are removed subsequent to the layered structure being bonded to the first substrate.

In accordance with another exemplary embodiment of the invention, there is provided a method of processing a semiconductor structure including providing a first substrate; providing a layered structure including a second substrate having an epitaxial layer provided thereon, the epitaxial layer having an in-plane lattice constant that is different from that of the first substrate and a threading dislocation density of less than $10^7$ cm$^{-2}$; bonding the first substrate to the layered structure; and removing the second substrate.

BRIEF DESCRIPTION OF THE DRAWINGS

FIGS. 3A–3D are a process flow block diagram for producing a high quality SiGe layer on Si without the presence of a graded buffer layer using wafer bonding and substrate removal;

FIGS. 4A–4D are a process flow block diagram showing planarization steps used to improve the surface quality before bonding or after substrate removal;

FIGS. 5A–5F are a process flow block diagram for producing a high quality InGaAs layer directly on Si by iterating the graded layer bonding process;

FIGS. 7A–7D are a process flow block diagram for producing high quality mismatched epitaxial layers directly on Si using patterned trenches in the epitaxial layer as a sink for dislocations and for strain relief.

DETAILED DESCRIPTION OF THE INVENTION

The invention involves a semiconductor structure and a method of producing a thin, low dislocation density, epitaxial film directly on a lattice mismatched substrate. A thin layer of a material can be deposited on a substrate including a different material using a graded layer to taper any materials properties difference. The graded composition layer often poses a limit to many applications, since the graded layer possesses many dislocations and is quite thick relative to other epitaxial layers and to typical step-heights in CMOS processes. However, if the surface of the deposited semiconductor material is relatively free of defects, the surface can be bonded to another substrate. Subsequently, the original substrate and graded layer can be removed to produce an integrated layer on the desired substrate without the graded region.

Three semiconductor substrates dominate the substrate market: Si, GaAs, and InP. The volumes and diameters of the wafers scale accordingly: Si has the largest wafer size (8 inch, moving to 12 inch) and volumes, GaAs is the next largest (4 inch, moving to 6 inch diameter), and InP trails with the smallest volumes and wafer size (2 inch, moving to 3 and 4 inch). The lattice constant of the substrate increases from Si to GaAs to InP, and the mechanical strength decreases with increasing lattice constant. Thus, Si is the easiest crystal to grow to large diameter with great perfection, whereas InP is the most difficult of the three.

Although the mechanical strength was one of the many reasons that Si began as the favored substrate, the ability to make metal-oxide-semiconductor field-effect-transistors (MOSFETs) allowed markets, chip size, and wafer size to grow rapidly, installing an infrastructure world-wide that continues to make Si the low-cost platform for microelectronics. GaAs and InP are useful in some electronics applications; however, their markets are primarily driven by optoelectronics. Integrating GaAs or InP devices on a Si substrate has tremendous advantages since it allows for the integration of Si electronics with optical devices. However, due to the discrepancy in wafer diameters, a straight bonding process results in only a portion of the Si wafer being covered with GaAs or InP. Because the wafer size difference involves both market size and technology issues, it is a significant barrier to the successful integration of III–V materials with Si using wafer bonding.

Figure 1:
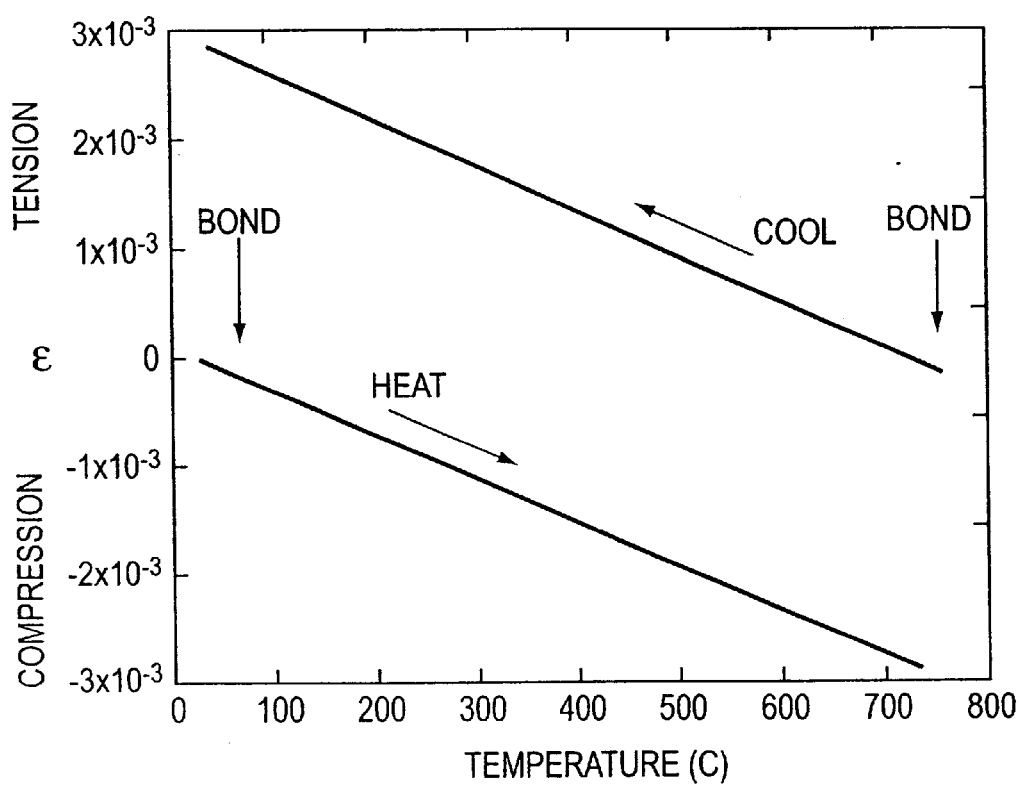
FIG. 1 is a graph showing the strain induced when a 500 μm thick GaAs wafer and a 500 μm thick Si wafer are bonded at room temperature and annealed at high temperature, and bonded at high temperature and cooled to room temperature.

The other issue in question is the thermal expansion difference between the substrate materials being bonded. FIG. 1 is a plot of the strain developed if a GaAs wafer and a Si wafer (each 500 µm thick) are brought in contact at room temperature and heated for bonding, as well as the case where the wafers are bonded at high temperature and cooled down to room temperature. The strains are approximate, using only the linear term in the thermal expansion of the lattice with temperature. Note that if the wafers are bonded at room temperature and heated, a significant strain develops in the bonded pair. This strain can either crack the assembly, or simply cause the wafers to debond. The additional driving force for debonding can be calculated using the Stoney formula, which describes the curvature of a composite structure like the two bonded wafers:

$$\left(\frac{d_f + d_s}{2}\right)F_f = \frac{w}{12R}[Y_f d_f^3 + Y_s d_s^3]$$

where $d_s$ is the thickness of the substrate, $d_f$ is the thickness of the film, $F_f$ is the force on the film, w is the width of the film and substrate, R is the radius of curvature, $Y_f$ is the biaxial modulus of the film, and $Y_s$ is the biaxial modulus of the substrate.

If the substrate and film have an equal thickness of 500 µm ($d=d_s=d_f$), the formula simplifies to:

$$R = \frac{d}{12\varepsilon}\left[1 + \frac{Y_{Si}}{Y_{GaAs}}\right].$$

Figure 2:
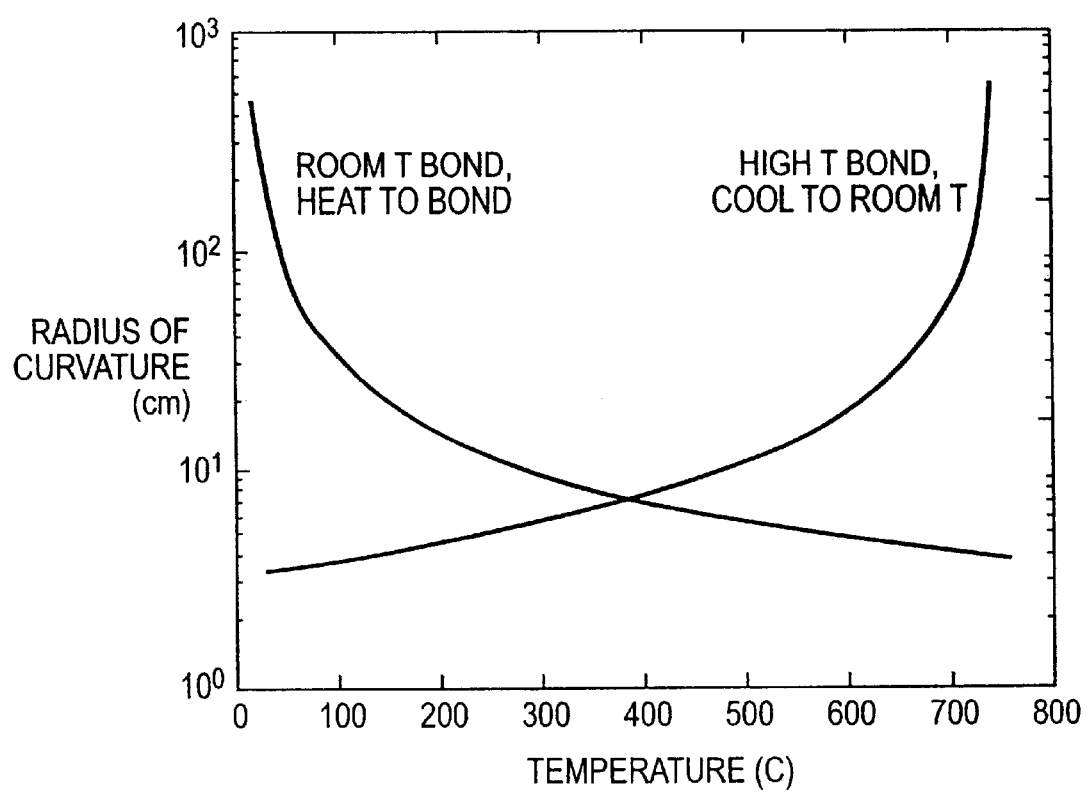
FIG. 2 is a graph showing the curvature induced when a 500 μm thick GaAs wafer and a 500 μm thick Si wafer are bonded under two conditions: bonding at room temperature and subsequently annealing at high temperature anneal, and bonding at high temperature and subsequently cooling to room temperature.

FIG. 2 is a plot of the curvature of the substrate composite of a GaAs wafer bonded to a Si wafer, for the case of bonding at room temperature and heating, as well as bonding at high temperature and cooling. In the case of bonding at room temperature and heating, the combination of the strain shown in FIG. 1 and the resulting curvature shown in FIG. 2 leads to debonding. In the case of bonding at high temperature, the bonding is very strong, and therefore the substrate composite at room temperature is curved, rendering the material useless in most fabrication facilities, especially Si CMOS facilities, where wafer flatness is very important for compatibility with processing equipment. In addition, the substrate composite contains enough strain energy that it is energetically feasible to introduce cracks, and thus the composite tends to fracture spontaneously or with slight mechanical abrasion.

In order to understand how the current invention circumvents the two issues described, the case of integrating a Ge layer or GaAs layer onto a crystalline Si substrate will now be described. FIGS. 3A–3D are a process flow block diagram for producing a high quality SiGe layer on Si without the presence of a graded buffer layer using wafer bonding and substrate removal in accordance with an exemplary embodiment of the invention.

Initially, a graded layer 302 of SiGe is provided on a Si substrate 300 to produce the desired lattice constant with a minimal number of threading dislocations at the top surface. For a review of this process, see E. A. Fitzgerald et al., J. Vac. Sci. and Tech. B 10, 1807 (1992), incorporated herein by reference. Through this process, a uniform SiGe layer 304 is produced at the surface of the structure, even though a silicon substrate exists below. The Ge concentration in this $Si_{1-x}Ge_x$ virtual substrate can range from 0.5–100% (0.005 <x<1). The SiGe surface is then bonded to a second silicon wafer 306, or, if the graded layer is graded to pure Ge, a Ge or GaAs layer deposited on the Ge can be bonded to the silicon wafer. Whatever the surface layer composition, the original substrate 300 (on which the graded layer was deposited) as well as the graded layer 302 are then removed, producing a relaxed novel material directly on silicon.

Although compositional grading allows control of the surface material quality, strain fields due to misfit dislocations in the graded layer can lead to roughness at the surface of the epitaxial layer. This roughness poses a problem for wafer bonding, where smooth surfaces are required for strong, uniform bonded interfaces. Implementation of a planarization technique, such as chemomechanical polishing (CMP), before bonding will eliminate this surface roughness and thus enable high quality bonds.

FIGS. 4A–4D are a process flow block diagram showing planarization steps used to improve the surface quality before bonding or after substrate removal. Initially, a graded layer 402 is provided on a substrate 400 to produce the desired lattice constant with a minimal number of threading dislocations at the top surface. A uniform epitaxial layer 404 for transfer is produced at the surface of the structure. The surface of the epitaxial layer 404 is then planarized so it can be bonded to a second substrate 406. The original substrate 400 (on which the graded layer was deposited) as well as the graded layer 402 are then removed, resulting in a relaxed material directly on the second substrate.

Additionally, planarization techniques can be used on the relaxed layer after the original substrate and graded layer are removed. This step is useful if the substrate removal produces a rough surface (as in delamination techniques).

The practical success of the invention is that the thermal expansion coefficient of the two substrate materials are similar or identical, and the wafers are of the same diameter. Thus, the graded layer method of creating a virtual substrate material on top of silicon removes the two constraints that have prevented wafer bonding from effectively producing large areas of heterogeneously integrated materials. With this technique, GaAs, Ge, and any concentration of SiGe can be integrated on Si without the presence of thick graded layers.

It is important to note that although the wafer composite is guaranteed to be nearly flat due to the two substrates being identical material, the epitaxial layers have different thermal expansion coefficients than the substrates and thus experience a large stress and strain. If the thermally induced strain is high enough, it is possible to cause further relaxation of the epitaxial layers. In principle, this relaxation can be benign. For example, if the strain level is great enough to command threading dislocation motion at a given temperature, but the strain level is low enough that the nucleation of new dislocations is not encouraged, then no negative effect will be encountered.

This level of strain can be beneficial. If patterns have been etched in the epitaxial layers before bonding, the threading dislocation motion created by the strain moves the threading dislocations to the pattern edges, thus lowering the effective threading dislocation density at the top surface of the epitaxial layers. However, too high a strain level due to excessive heating of the bonded composite will nucleate new dislocations, increasing the threading dislocation density in the epitaxial layer. A guideline for defining the excess strain level for dislocation nucleation can be gleaned from the known experimental data in a myriad of lattice-mismatched semiconductor systems. For lattice mismatches near 1% or less, the threading dislocation density is usually less than $10^7$ cm$^{-2}$, and thus may not increase the threading dislocation density over the level already present in the layers ($10^5$–$10^6$ cm$^{-2}$). For greater than approximately 1–1.5% strain, the threading dislocation density in relaxed material is quite high. Thus, the objective is to not let the strain in the sandwiched epitaxial layer approach 1% in order to minimize the chance for increased threading dislocation density.

The synergy of combining the graded layer and bonding methods extends beyond the embodiments described. For example, the process can be repeated multiple times, and the process remains economical since inexpensive Si wafers are used for the original host wafers. FIGS. 5A–5F are a process flow block diagram for producing a high quality InGaAs layer directly on Si by iterating the graded layer bonding process. Multiple process iterations can be used to integrate InGaAs alloys on Si. In order to produce InGaAs on Si with only compositional grading, a Si substrate 500 is graded from Si to a pure Ge layer 504 using a SiGe grading layer 502, and subsequently graded from GaAs to InGaAs by depositing a GaAs layer 506 and grading the In composition with a graded layer 510. However, for high In concentrations, a thick region of graded InGaAs is needed to keep the threading dislocation density low at the surface. This great thickness results in cracking upon cooling from the growth temperature.

The invention can be used to first create a thin layer of GaAs 506 on a Si substrate 508 in which the Ge 504 and SiGe 502 graded layers have been removed. Subsequently, In can be compositionally graded to achieve the desired InGaAs layer 512. The fact that the SiGe and Ge are removed allows for the grading of thicker InGaAs layers, since Ge has a similar thermal expansion coefficient as the III–V materials. If the graded InGaAs layer were undesirable in a particular application, then the process can be repeated to produce InGaAs directly on a Si substrate 514. If the In concentration in the graded layer 510 is graded to near 50% In, then this method can be used for creating InP layers on Si, useful for optoelectronic integration of $\lambda=1.55$ $\mu$m devices with Si electronics.

It will be appreciated that a thin Ge or III–V material layer on Si can be created with the process shown in FIGS. 5A–5F. These materials are very useful in fabricating optoelectronic integrated circuits (OEICs) on Si. The thin layer might be Ge or GaAs or In$_{0.5}$Ga$_{0.5}$P after SiGe grading, or may also be InGaAs or InP after InGaAs grading. Essentially, by utilizing either one or multiple bonding sequences, thin layers of Si$_{1-t}$Ge$_t$, Al$_v$(In$_w$Ga$_{1-w}$)$_{1-v}$As, or (In$_x$Ga$_{1-x}$)$_z$(As$_{1-y}$P$_y$)$_{1-z}$ can be produced on a mismatched substrate where $0.005 < t < 1$, $0 < v < 1$, $0 < w < 1$, $0 < x < 1$, $0 < y < 1$, and $0 < z < 1$. These thin layers are removed from the areas where Si electronics are to be fabricated using standard photolithography. The remaining areas containing the thin material for optoelectronics are protected with a SiO$_2$ layer or other material during Si circuit processing. After substantial Si circuit processing, removing the SiO$_2$ exposes the thin optoelectronic areas, and subsequently optoelectronic devices are fabricated.

An advantageous feature of the invention is the ability to integrate a thin layer. After removal of the original wafer and graded layer, only a thin layer of the thermally mismatched material is present. Thus, the thin film on thick substrate approximation holds:

$$R = \frac{1}{6\varepsilon_f}\left(\frac{Y_s}{Y_f}\right)\frac{d_s^2}{d_f}.$$

For a thin film of 0.1 $\mu$m GaAs on a 500 $\mu$m Si substrate, the radius of curvature is always much greater than $10^4$ cm for the temperature range of room T to 750C for the structure. Such a small amount of curvature will not affect most processing. However, if there is a need to remove this small curvature, other epitaxial layers and/or layers on the backside of the wafer can be deposited to easily compensate for the strain, leading to wafers with less curvature.

Figure 6:
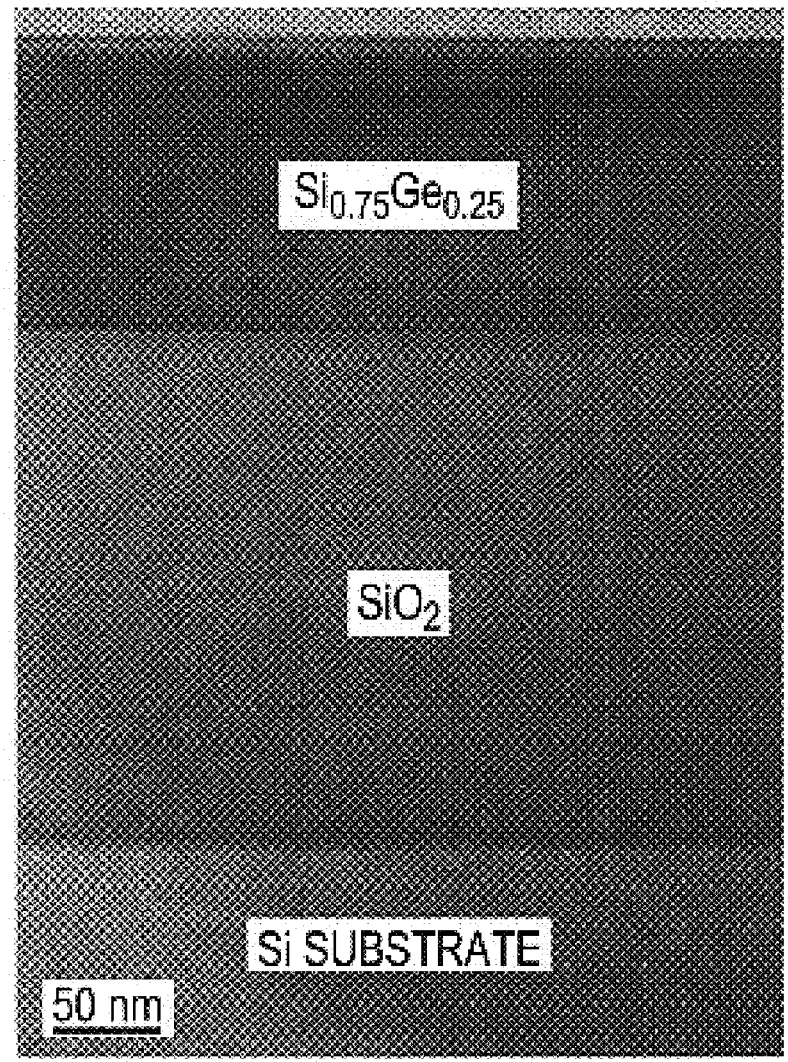
FIG. 6 is a cross-sectional transmission electron micrograph of a relaxed, low dislocation density SiGe film on an oxidized substrate.

All of the provided examples exemplify semiconductor/semiconductor bonding. However, other materials present on the wafer surface can be present as well and included by bonding into the structure. For example, instead of bonding only to bare Si surfaces, the epitaxial wafer can be bonded to a Si wafer coated with SiO$_2$. Using the process described, a thin GaAs/SiO$_2$/Si structure is created, which is very useful for optical interconnects. The SiO$_2$ layer allows for both optical and electronic isolation of the top optoelectronic layer. An example of bonding a relaxed SiGe alloy on Si to SiO$_2$/Si is shown in FIG. 6. FIG. 6 is a cross-section transmission electron micrograph of an exemplary SiGe/SiO$_2$/Si structure. The process used to create the material is the same as shown in FIGS. 3A–3D, except the SiGe has been bonded to a Si wafer with SiO$_2$ on its surface.

In addition, in an alternative exemplary embodiment of the invention, a structure can be fabricated in accordance with the previously described process in which the epitaxial layer is eventually applied to a glass substrate rather than a Si substrate. The glass substrate would need to have a thermal expansion coefficient that is similar to that of the substrate on which the epitaxial layer is deposited, e.g., Si.

FIGS. 7A–7D are a process flow block diagram for producing high quality mismatched epitaxial layers directly on Si using patterned trenches in the epitaxial layer as a sink for dislocations and for strain relief in accordance with an alternative exemplary embodiment of the invention. A graded layer 702, e.g., SiGe, Ge or GaAs, is provided on a first Si substrate 700. This layer is graded until a uniform layer 704 is produced. The uniform layer 704 is then patterned with vias and/or trenches before the bonding process. A second Si substrate is bonded to the uniform layer 704. Subsequently, the first Si substrate 700 and the graded layer 702 are removed resulting in a uniform layer, e.g., Si$_{1-y}$Ge$_y$, provided directly on a Si substrate.

In this way, tensile stress in the original graded structure is relieved, aiding the bonding operation. This variant also produces a flat structure with isolated patterns after release. For example, an array of trenches produces a series of mesas on the surface, and after bonding and removal, these mesas are areas of isolated, relaxed layers. In this embodiment, the epitaxial layer will not contribute to thermal bowing of the new structure. Additionally, since these mesas are isolated, the edges of the mesas act as sinks for dislocations, and thus thermal cycling of the material further reduces the threading dislocation density.

In all of the above processes, there are various ways of removing the graded layer/original substrate. One method is the well-known etch-back process, where the substrate is physically ground until quite thin, and then a chemical etch is used to stop at a particular layer. Another technique is the hydrogen-implant technique, in which a high dose of hydrogen is implanted below the surface of the layer to be released (in this case, the surface of the original substrate plus graded layer and uniform layer). After bonding, it is possible to fracture the implanted region, removing the original graded layer and substrate, and leaving the desired transferred layer.

Although the present invention has been shown and described with respect to several preferred embodiments thereof, various changes, omissions and additions to the form and detail thereof, may be made therein, without departing from the spirit and scope of the invention.

What is claimed is:

1. A semiconductor structure comprising:
   a first substrate; and
   an epitaxial layer bonded to said substrate, said epitaxial layer having a threading dislocation density of less than $10^7/cm^2$ and an in-plane lattice constant different from that of said first substrate; and
   an optoelectronic device disposed in at least a portion of the epitaxial layer.

2. The structure of claim 1 wherein the epitaxial layer comprises at least one of $Si_{1-x}Ge_x$ with 0.005<x<1, $In_xGa_{1-x}As$, $(In_xGa_{1-x})_z(As_{1-y}P_y)_{1-z}$, $In_xGa_{1-x}P$, and InP.

3. The semiconductor structure of claim 1, further comprising:
   a silicon circuit disposed on a portion of the substrate.

4. A semiconductor structure comprising:
   a first substrate; and
   an epitaxial layer bonded to said substrate, said epitaxial layer having a threading dislocation density of less than $10^7/cm^2$ and an in-plane lattice constant different from that of said first substrate,
   wherein said epitaxial layer is a segment of a previously fabricated layer structure including a second substrate with a compositionally graded layer and said epitaxial layer provided thereon, said second substrate and said graded layer being removed subsequent to said layered structure being bonded to said first substrate, the first substrate has a first diameter and the second substrate has a second diameter substantially similar to the first diameter.

5. A semiconductor structure comprising:
   a first substrate; and
   a epitaxial layer bonded to said substrate, said epitaxial layer having a threading dislocation density of less than $10^7/cm^2$ and an in-plane lattice constant different from that of said first substrate, and said epitaxial layer is planarized.

6. A semiconductor structure comprising:
   a first substrate; and
   an epitaxial layer bonded to said substrate, said epitaxial layer having threading dislocation density of less than $10^7/cm^2$ and an in-plane lattice constant different from that of said first substrate,
   wherein the structure comprising the substrate and the epitaxial layer is substantially flat.

7. The semiconductor structure of claim 6 wherein the structure comprising the substrate and the epitaxial layer has a radius of curvature greater than $10^4$ centimeters.

8. A semiconductor structure comprising:
   a first substrate, the substrate including an insulator layer; and
   an epitaxial layer bonded to said substrate, said epitaxial layer having a threading dislocation density of less than $10^7/cm^2$ and an in-plane lattice constant different from that of said first substrate.

9. A semiconductor substrate comprising:
   a first substrate;
   an epitaxial layer bonded to said substrate, said epitaxial layer having a threading dislocation density of less than $10^7\ cm^{-2}$ and an in-plane lattice constant different from that of said first substrate; and
   a circuit disposed over a portion of the substrate.

* * * * *

(12) INTER PARTES REEXAMINATION CERTIFICATE (0097th)
United States Patent
Fitzgerald

(10) Number: US 6,703,144 C1
(45) Certificate Issued: *Sep. 1, 2009

(54) HETEROINTEGRATION OF MATERIALS USING DEPOSITION AND BONDING

(75) Inventor: Eugene A. Fitzgerald, Windham, NH (US)

(73) Assignee: Amberwave Systems Corporation, Salem, NH (US)

Reexamination Request:
No. 95/000,170, Aug. 11, 2006

Reexamination Certificate for:
Patent No.: 6,703,144
Issued: Mar. 9, 2004
Appl. No.: 10/391,086
Filed: Mar. 18, 2003

(*) Notice: This patent is subject to a terminal disclaimer.

Related U.S. Application Data

(63) Continuation of application No. 09/764,182, filed on Jan. 17, 2001, now Pat. No. 6,602,613.
(60) Provisional application No. 60/177,084, filed on Jan. 20, 2000.

(51) Int. Cl.
| C30B 25/02 | (2006.01) |
| C30B 25/18 | (2006.01) |
| C30B 33/06 | (2006.01) |
| C30B 33/00 | (2006.01) |
| H01L 21/20 | (2006.01) |
| H01L 21/02 | (2006.01) |
| H01L 21/70 | (2006.01) |
| H01L 21/762 | (2006.01) |

(52) U.S. Cl. .................. 428/641; 257/E21.569; 257/E21.125; 257/E21.129; 117/953; 428/209; 428/446; 428/450; 428/642; 428/697; 428/698; 428/699; 428/704; 428/901

(58) Field of Classification Search ............... None
See application file for complete search history.

(56) References Cited

U.S. PATENT DOCUMENTS

| 5,210,052 | A | * | 5/1993 | Takasaki ................... 438/509 |
| 5,344,517 | A | * | 9/1994 | Houlding .................. 156/236 |
| 5,391,257 | A | * | 2/1995 | Sullivan et al. ............ 438/458 |
| 5,439,843 | A |   | 8/1995 | Sakaguchi et al. |
| 5,466,948 | A | * | 11/1995 | Worley ....................... 257/3 |
| 5,498,199 | A | * | 3/1996 | Karlsrud et al. ........... 451/289 |
| 5,833,749 | A | * | 11/1998 | Moritani et al. ........... 117/101 |
| 6,254,677 | B1 | * | 7/2001 | Hashio et al. .............. 117/206 |
| 6,703,144 | B2 |   | 3/2004 | Fitzgerald |
| 6,806,171 | B1 | * | 10/2004 | Ulyashin et al. ........... 438/492 |

FOREIGN PATENT DOCUMENTS

| EP | 927777 A1 | * | 7/1999 |
| WO | WO 98/08664 A1 | * | 3/1998 |

OTHER PUBLICATIONS

Yablonovich et al, "Van de Waals bonding of GaAs on Pd leads to a permanent, solid–phase–topotaxial, metallurgical bond," Appl. Phys. Lett., vol. 59 (24), Dec. 9, 1991, pp. 3159–3161.*

(Continued)

*Primary Examiner*—Alan Diamond

(57) ABSTRACT

A semiconductor structure including a first substrate, and an epitaxial layer bonded to the substrate. The epitaxial layer has a threading dislocation density of less than $10^7$ cm$^{-2}$ and an in-plane lattice constant that is different from that of the first substrate and a second substrate on which the epitaxial layer is fabricated. In another embodiment, there is provided a method of processing a semiconductor structure including providing a first substrate; providing a layered structure including a second substrate having an epitaxial layer provided thereon, the epitaxial layer having an in-plane lattice constant that is different from that of the first substrate and a threading dislocation density of less than $10^7$ cm$^{-2}$; bonding the first substrate to the layered structure; and removing the second substrate.

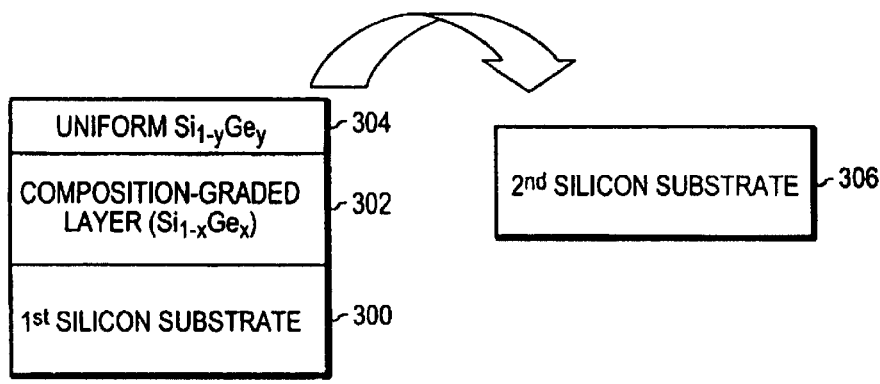

OTHER PUBLICATIONS

Shah et al, "Epitaxial lift–off GaAs HEMT's," IEEE Transactions on Electron Devices, vol. 42, No. 11, pp. 1877–1881, Nov. 1995.*

Nakai, "Manufacturing large diameter GaAs substrates for epitaxial devices by the VB method," IEEE, 1998, pp. 243–246.*

Fitzgerald et al, "Dislocations in relaxed SiGe/Si Heterostuctures," Phys. Stat. Sol. (a), vol. 171, pp. 227–238, published online Jan. 29, 1999.*

Yablonovitch et al, "Extreme Selectivity in the Lift–Off of Epitaxial GaAs Films," Appl. Phys. Lett. vol. 51, pp. 2222–2224 (1987).*

Pollentier et al, "Integration of GaAs LEDs on Si by Epi–lift–off," ESSDERC '89, pp. 401–404, (1989).*

Demeester et al, "Epitaxial lift–off and its applications," Semicond. Sci. Technol., (1993), pp. 1124–1135.*

Chang et al, "Epitaxial lift–off arrays of GaAs LEDs over wafer–scale Si VLSI for optical interconnect technology," OFC '96 Technical Digest, pp. 167–168 (1996).*

Pollentier, "Fabrication of a GaAs–AlGaAs GRIN–SCH SQW Laser Diode on Silicon by Expatial Lift-Off," IEEE Photonics Technology Letters, vol. 3, No. 2, pp. 115–117, Feb. 1991.*

Yoblonovitch, E., "Epitaxial Liftoff Technology," SPIE Optical Enhancements to Computing Technology vol. 1563, pp. 8–9, 1991.

Fitzgerald, E.A., et al., "Relaxed $GE_xSi_{1-x}$ Structures for III–V Integration with Si and High Mobility Two–Dimensional Electron Gases in Si," J. Vac. Sci. and Tech. B vol. 10, pp. 1807–1819, 1992.

Bruel, M., "Application of Hydrogen Ion Beams to Silicon on Insulator Material Technology," Nucl. Instr. and Meth. in Phys. Res. B, vol. 108, pp. 313–319, 1996.

E.A. Fitzgerald et al., "Nucleation mechanisms and the elimination of misfit dislocations at mismatchedinterfaces by reduction in growth area", J. Appl. Phys., vol. 65, pp. 2220–2237 (1989).

Wang, L.–W., et al., "Electronic structures of [110]–faceted self–assembled pyramidal InAs/GaAs quantum dots", Phys. Rev., B 59, 5678 (1999).

Greenwood, N.N., et al., "Chemistry of the Elements $2^{nd}$ Ed.", p. 331, B.–H., 1997.

M.T. Currie et al., "Controlling threading dislocation densities in Ge on Si using graded SiGe layers and chemical–mechanical polishing," Appl. Phys. Lett., 72, No. 14, Apr. 6, 1998, p. 1718.

S. Matsumoto et al., "Study on Bi–CMOS Devices Utilising SIMOX Technology," Electronic Letters, vol. 25, pp. 904–905 (1989).

* cited by examiner

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1–9 are cancelled.

\* \* \* \* \*